United States Patent
Hu et al.

(10) Patent No.: US 8,749,425 B1
(45) Date of Patent: Jun. 10, 2014

(54) REFERENCE CHARGE CANCELLATION FOR ANALOG-TO-DIGITAL CONVERTERS

(71) Applicant: Broadcom Corporation, Irvine, CA (US)

(72) Inventors: Jason Hu, Palo Alto, CA (US); Xinyu Yu, San Jose, CA (US); Jing Yang, Fremont, CA (US); Sumant Ranganathan, Saratoga, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/722,388

(22) Filed: Dec. 20, 2012

(51) Int. Cl.
*H03M 1/12* (2006.01)

(52) U.S. Cl.
USPC .......................................... 341/172; 341/155

(58) Field of Classification Search
USPC .................. 341/155, 122, 172, 118, 120
See application file for complete search history.

(56) References Cited

U.S. PATENT DOCUMENTS

| | | | | |
|---|---|---|---|---|
| 3,585,634 | A * | 6/1971 | Sharples | 341/172 |
| 6,573,693 | B2 * | 6/2003 | Okamoto | 323/273 |
| 7,286,074 | B2 * | 10/2007 | Kudoh et al. | 341/162 |
| 2012/0133800 | A1 * | 5/2012 | Jung et al. | 348/241 |

* cited by examiner

*Primary Examiner* — Peguy Jean Pierre
(74) *Attorney, Agent, or Firm* — Nathan O. Greene; Brinks Gilson & Lione (57) ABSTRACT

An analog-to-digital converter (ADC) includes reference charge cancellation features to at least partially offset a voltage distortion on a bypass capacitor of a reference buffer due to a voltage reference hit taken by a switched capacitor bank with which the bypass capacitor is connected. The charge cancellation may be configured in logic to be input signal dependent because different resolved bits or transitions between resolved bits may cause different amounts of voltage reference hits. By adjusting the bypass capacitor in response to each of at least some of the reference hits while resolving a word of bits, the reference voltage signal provided by the bypass capacitor undergoes far less settling, remaining more stable and linear for a more accurate reference voltage. Furthermore, a smaller capacitor may be used for the bypass capacitor, reducing power consumption and area on chip.

20 Claims, 9 Drawing Sheets

REFERENCE CHARGE CANCELLATION FOR ANALOG-TO-DIGITAL CONVERTERS

TECHNICAL FIELD

This disclosure relates to analog-to-digital converters. In particular, this disclosure relates to reference charge cancellation in analog-to-digital converters (ADC) to compensate for voltage hits on reference buffer capacitors, which allow the capacitors to be smaller, saving significantly on area and power.

BACKGROUND

Rapid advances in electronics and communications technologies, driven by consumer demand, have resulted in the widespread adoption of data-driven devices, including those for handling high-speed data transfer. The data transfer process may include a digit-to-analog converter (ADC) to generate digital data from an analog signal. Different types of ADCs are used, depending on the application, and the present disclosure relates to any sort of ADC architecture, including and not limited to a pipelined successive approximate architecture (SAR) ADC, a sigma-delta ADC with a switched capacitor feedback digital-to-analog converter (DAC), a multiplying DAC and to any switch capacitor reference architecture.

BRIEF DESCRIPTION OF THE DRAWINGS

The systems and methods may be better understood with reference to the following drawings and description. In the figures, like reference numerals designate corresponding parts throughout the different views.

DETAILED DESCRIPTION

The discussion below refers to reference charge cancellation in analog-to-digital converters (ADC) to compensate for voltage hits on reference buffer (or bypass) capacitors. The reference charge cancellation may allow the capacitors to be smaller, saving significantly on area, power and linearity. ADCs need accurate references due to signal dependent and signal independent settling, which may require a large area for reference bypass capacitor(s) up to about 1 nF and/or high power reference buffers. For an asynchronous successive approximate architecture (SAR) ADC, among others, reference kickback can occur at any time during its evaluation, depending on input signal profile and speed of the conversion. (Reference kickback may also be referred to as a "reference hit.") This reference kickback timing is difficult to handle and requires high-speed reference buffers to facilitate conversion. The speed for a SAR ADC, for example, may be anywhere from 1 MHz to 200 MHz, or higher. Reference "kickback" refers to a level of swing in a waveform ($V_{refp}$-$V_{refn}$) of reference voltage used to generate a digital version of an input analog signal. $V_{refp}$ and $V_{refn}$ represent the differential reference voltages provided by the bypass capacitors of the reference buffer.

Figure 1:
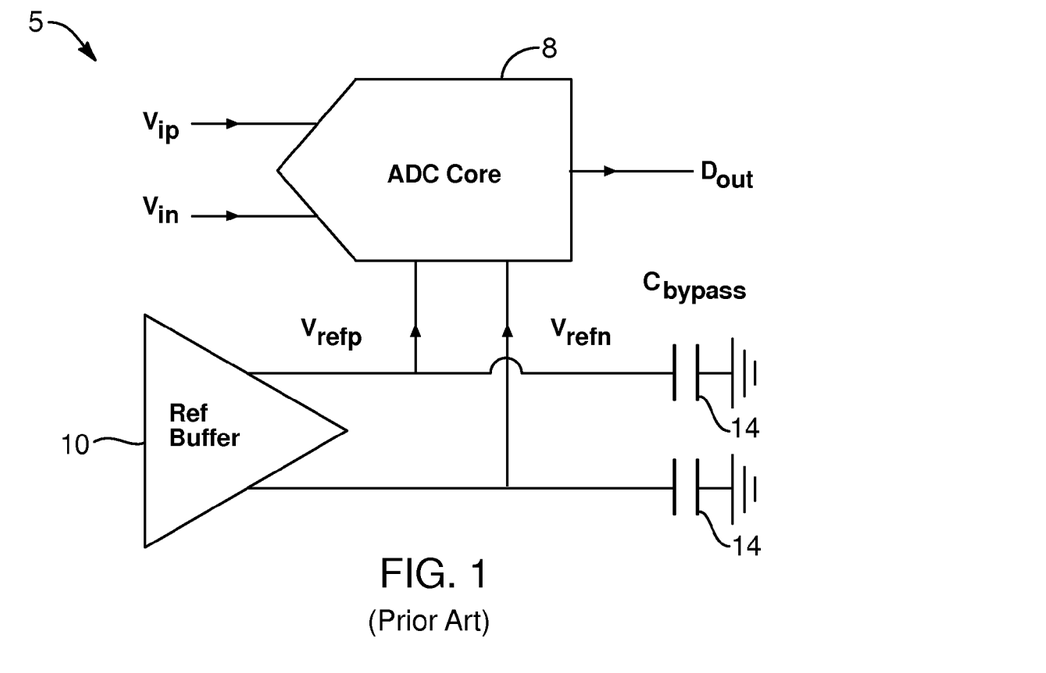
FIG. 1 is a block diagram of an exemplary prior art analog-to-digital converter (ADC).

FIG. 1 is a block diagram of an exemplary prior art analog-to-digital converter (ADC) 5, showing an ADC core 8 into which comes differential positive and negative inputs ($V_{ip}$ and $V_{in}$) and which outputs a resolved bit, or more typically, an output word of multiple bits (as examples, the word may be a 5 bit or an 8 bit digital representation of the analog input). The ADC resolves each bit sequentially until all of the bits in the digital representation are generated. Furthermore, a single-ended input may also be converted, and so the input signal need not be differential.

Figure 4:
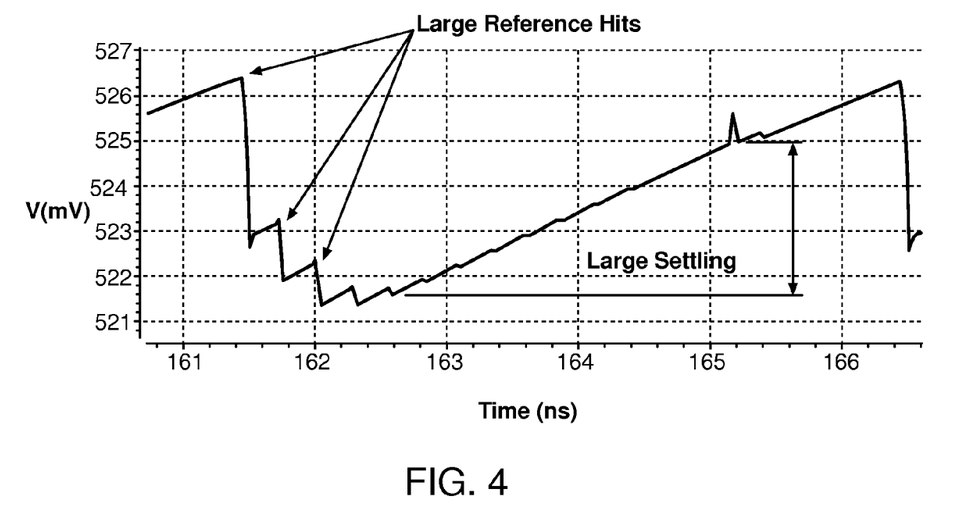
FIG. 4 is a graph of a reference settling waveform ($V_{refp}$-$V_{refn}$) of the ADC of FIG. 1, showing large reference hits and settling.

A reference buffer 10 may include or be coupled with bypass capacitors 14 that hold a reference voltage and that provide a "reference hit" when switched capacitors of the ADC core change voltage in an attempt to approximate the input signal. "Coupled with" herein means that components may be connected directly or indirectly through one or more intermediate components. The reference hit results in adding charge to the switched capacitor(s) from the bypass capacitors 14, or alternatively, subtracting charge from the switched capacitor(s) onto the bypass capacitor. The reference hit, as can be seen in FIG. 4, causes a signal spike or signal distortion on the reference voltage, thereby negtatively affecting the linearity of the ADC's operation.

A reference hit occurs when the ADC core 8 changes voltage on switched capacitors to better estimate whether a sampled input signal should be considered a one or a zero, which causes some voltage transfer between the bypass capacitor(s) 14 and the switched capacitor(s) in the ADC core. FIG. 4 is a graph of a reference settling waveform ($V_{refp}$-$V_{refn}$) of the ADC of FIG. 1, showing large reference hits ("Large Reference Hits") and settling ("Large Settling") as bits are being resolved during an evaluation period. The present innovation greatly reduces both the reference hits and the settling, as will be shown.

Figure 2:
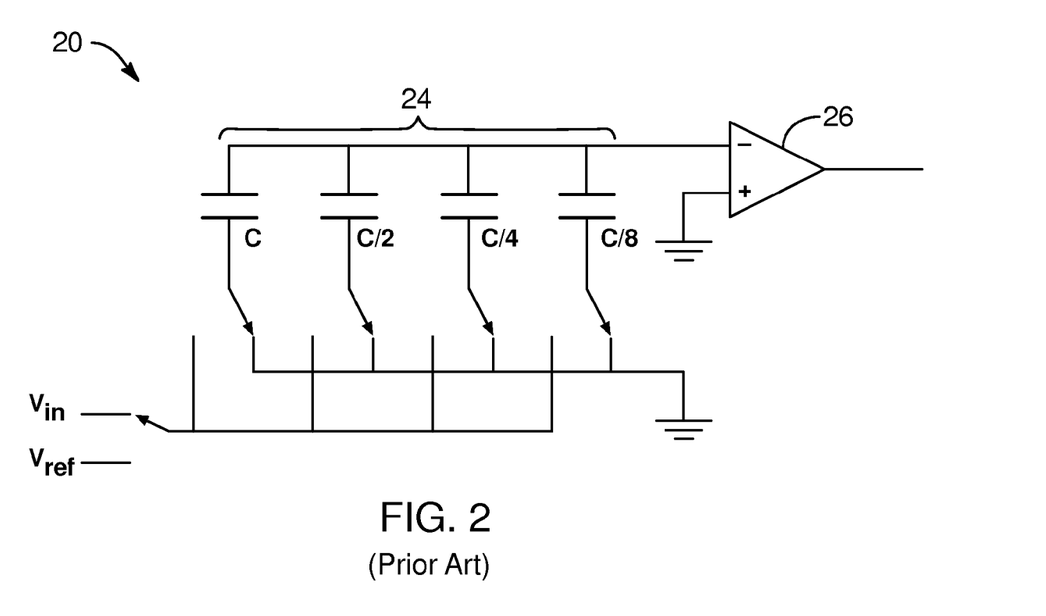
FIG. 2 is a block diagram of an exemplary prior art switched capacitor ADC that may make up a core of the ADC of FIG. 1.

FIG. 2 is a block diagram of an exemplary switched capacitor ADC 20 that may make up the ADC core 8 of the ADC 5 of FIG. 1. In the architecture of the ADC 20, an array of capacitors 24 may be switched under digital control to resolve digital bit values for an analog input signal ($V_{in}$), one bit at a time. Comparator-based switched-capacitor charge transfer may occur in two phases or steps, including sampling and charge transfer, the latter of which includes evaluation to resolve the bits. Accordingly, the charge transfer or evaluation phase may be further broken down into multiple operations, ultimately resulting in a resolved word of some number of multiple bits.

More specifically, all the capacitors within the array may be switched to the input signal, $V_{in}$, during sampling. The capacitors now have a charge equal to their respective capacitance times the input voltage, or $Q_i = V_{in}C/2^i$. The capacitors are then switched to ground so that the charge at the input of a comparator 26 is $-V_{in}$. The most significant bit (MSB) capacitor of the capacitors 24 may be switched to $V_{ref}$, thus receiving a reference hit from a bypass capacitor (FIG. 1), where $V_{ref}$ corresponds to the full-scale range of the ADC 20. The MSB capacitor forms a 1:1 divided capacitance between the MSB capacitor and the rest of the array 24, and the input voltage to the comparator 26 is now equal to $-V_{in}+V_{ref}/2$. If $V_{in}$ is greater than $V_{ref}/2$, than the comparator outputs a digital one (1) as the MSB, otherwise it outputs a digital 0 as the MSB at the output. Each capacitor of the array is tested in this manner for sequentially significant bits as the comparator input voltage converges to zero, thus generating a word (or other group) of resolved bits.

Figure 3:
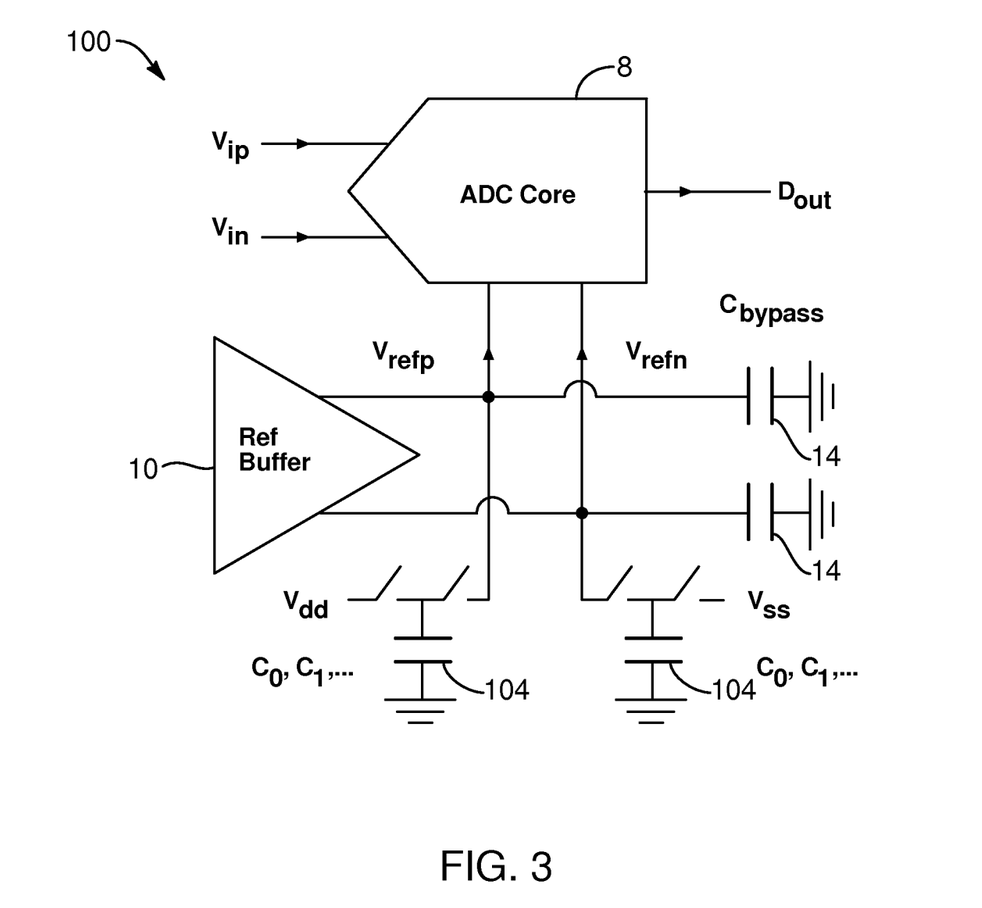
FIG. 3 is a block diagram of an exemplary modified ADC according to the present disclosure, using charge cancellation capacitors.

FIG. 3 is a block diagram of an exemplary modified ADC 100 according to the present disclosure, using charge cancellation capacitors 104. The charge-cancelling capacitors 104 provide one embodiment of a charge cancellation circuit, others of which will be disclosed later. In this embodiment, the charge cancellation capacitors 104 may be pre-charged, some to different voltages, or the capacitors 104 may be of different sizes to provide different amounts of voltage source or voltage sink.

The charge cancellation capacitors 104 are connected with the switched capacitors 24 of the ADC core 8 (FIG. 2). The switched capacitor(s) may take a reference hit from a bypass capacitor 14 while resolving a bit. A cancellation capacitor 104 may adjust the charge on the bypass capacitor 14 a determined amount to reverse, at least in part, the reference hit provided by the bypass capacitor. Alternatively, the adjustment may depend on the input signal and thus the amount of change may depend on the resolved bit or a transition between an immediately preceding resolved bit and the resolved bit. In either case, the cancellation capacitor(s) provide an adjustment in charge on the bypass capacitor to compensate for the reference hit, which may also adjust the voltage on the bypass capacitor.

By providing charge cancellation on the bypass capacitors, the bypass capacitors 14 need not be as large as those shown in FIG. 1 because the bypass capacitors do not need to have as much charge or hold the charge as long as is required in the ADC of FIG. 1. This allows a significant reduction the size of the bypass capacitor (by a factor of 10) and thus reduces overall size of the ADC circuit, which therefore requires less power. For instance, where a 1 nF bypass capacitor was required before, now a 500 pF capacitor may be employed.

Figure 5:
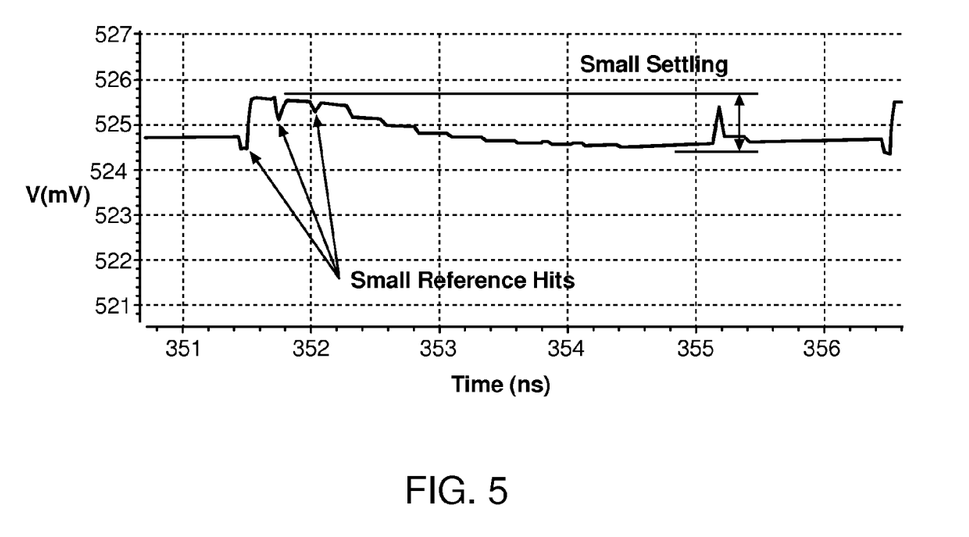
FIG. 5 is a graph of a reference settling waveform ($V_{refp}$-$V_{refn}$) of the ADC of FIG. 3, showing much smaller reference hits and settling.

FIG. 5 is a graph of a reference settling waveform ($V_{refp}-V_{refn}$) of the ADC of FIG. 3, showing much smaller reference hits and settling when compared with the settling waveform of FIG. 4. This provides less power-hungry, more stable and linear operation of the ADC in which the reference voltages are more accurate. Better accuracy may be especially advantageous for signal dependent operation in which settling can vary in greater swings (FIG. 3), especially within high-speed circuits.

Figure 6:
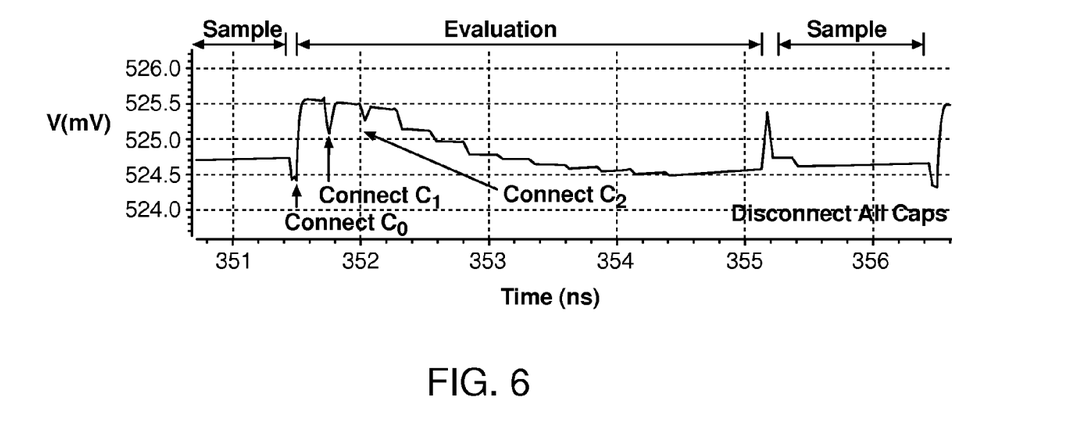
FIG. 6 is a graph of a detailed reference settling waveform of the ADC of FIG. 3, showing timing of connecting different sized cancellation capacitors for optimum cancellation and settling.

FIG. 6 is a graph of a detailed reference settling waveform of the ADC of FIG. 3, showing the timing of connecting different sized cancellation capacitors 104 for optimum cancellation and settling. Timing may be conducted in a cancellation circuit connected with the switched capacitors of the ADC 5 by connecting different sized capacitors at different times depending on size of reference hit, allowing for sufficient, but not too much, charge cancellation. As shown in FIG. 6, $C_0$ may be first connected during a first clock cycle, followed by connecting $C_1$ during a next clock cycle, then $C_2$ during a third clock cycle, and so forth. A more-detailed explanation of the clock and clock cycles that control the timing of the hits will be provided with reference to FIGS. 7 and 8.

For example, it may be expected that the largest reference hit may come on the MSB capacitor that leads off the evaluation period or settling phase ($_{settling}$), and that reference hit sizes may vary by a determined fixed or variable amount as the reference voltages settle. In an input signal independent example, progressively smaller reference hits may be expected with each clock cycle, and this can be seen in the example of FIG. 6 at "Connect $C_0$," "Connect $C_1$," and "Connect $C_2$," so progressively smaller capacitors may be used at each clock cycle during the settling phase. Accordingly, the cancellation capacitors 104 may add a variable amount of extra charge synched with the reference hit timing to provide cancellation with settling. The approach reduces the size of reference settling. The choice of values of the different sized cancellation capacitors 104 may be dependent on design and be hard-coded into the cancellation circuitry.

The cancellation capacitors 104 may be disconnected and pre-charged to voltages larger than $V_{refp}$ and $V_{refn}$, shown in FIG. 3 as $V_{dd}$ and $V_{ss}$, respectively, during a sampling phase ($_{sampling}$). This will allow charge to be added to or removed from the switched capacitors during the settling phase ($_{settling}$). At least one of the cancellation capacitors 104 may also be pre-charged to voltages smaller than $V_{refp}$ and $V_{refn}$ to remove charge from the switched capacitors where voltage needs to be reduced for a closer estimation of a resolved bit during the settling phase. Some of the cancellation capacitors 104 may be pre-charged to voltages larger than the reference voltages and others to voltages smaller than the reference voltages.

In an input signal dependent example, reference hits may depend on the input signal. All possible sizes of reference hits expected based on expected inputs to the ADC may be calculated in advance. During conversion, for each input value, a charge cancellation circuit (206 in FIG. 7) may choose the correct amount of extra charge for cancellation based on an output of the ADC, such as a SAR ADC output.

Different sized capacitors may be provided to handle the different expected reference hits, and may be chosen based on the ADC output, e.g., the resolved bit(s). Alternatively, the same sized capacitors may be pre-charged to different voltages, or a current source or sink may be switched within the cancellation circuit and turned on for a determined period of time to transfer sufficient cancellation charge to counteract the reference hit on the bypass capacitor(s).

Figure 7:
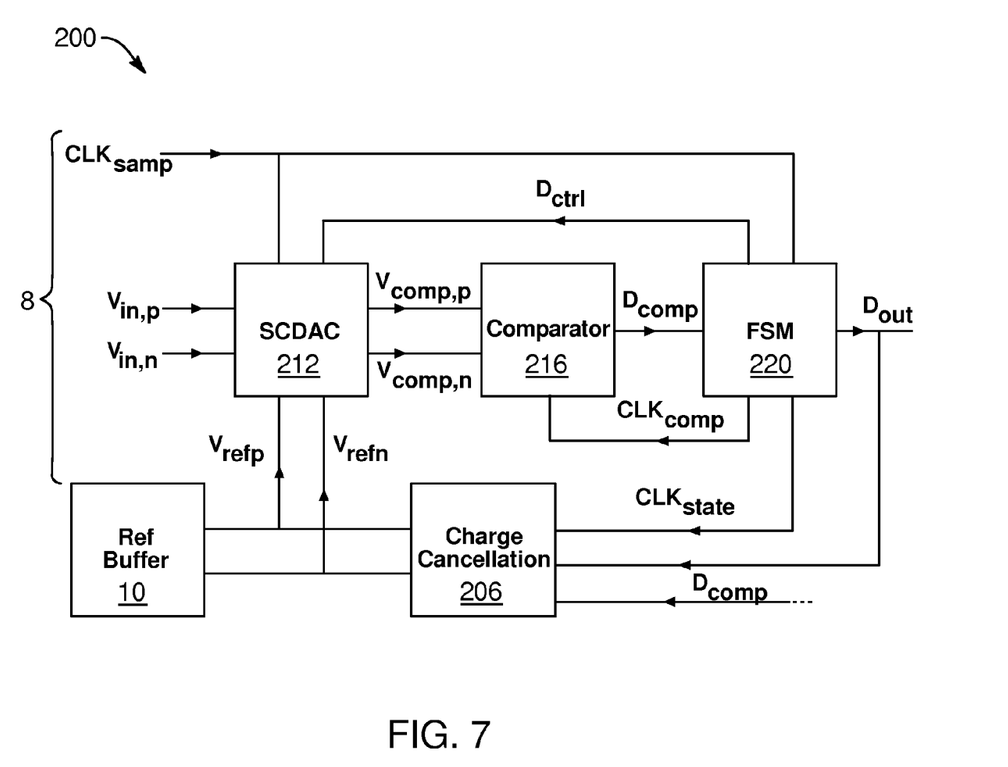
FIG. 7 is a block diagram of an exemplary ADC that includes the ADC core of FIG. 3 and a charge cancellation circuit.
Figure 8:
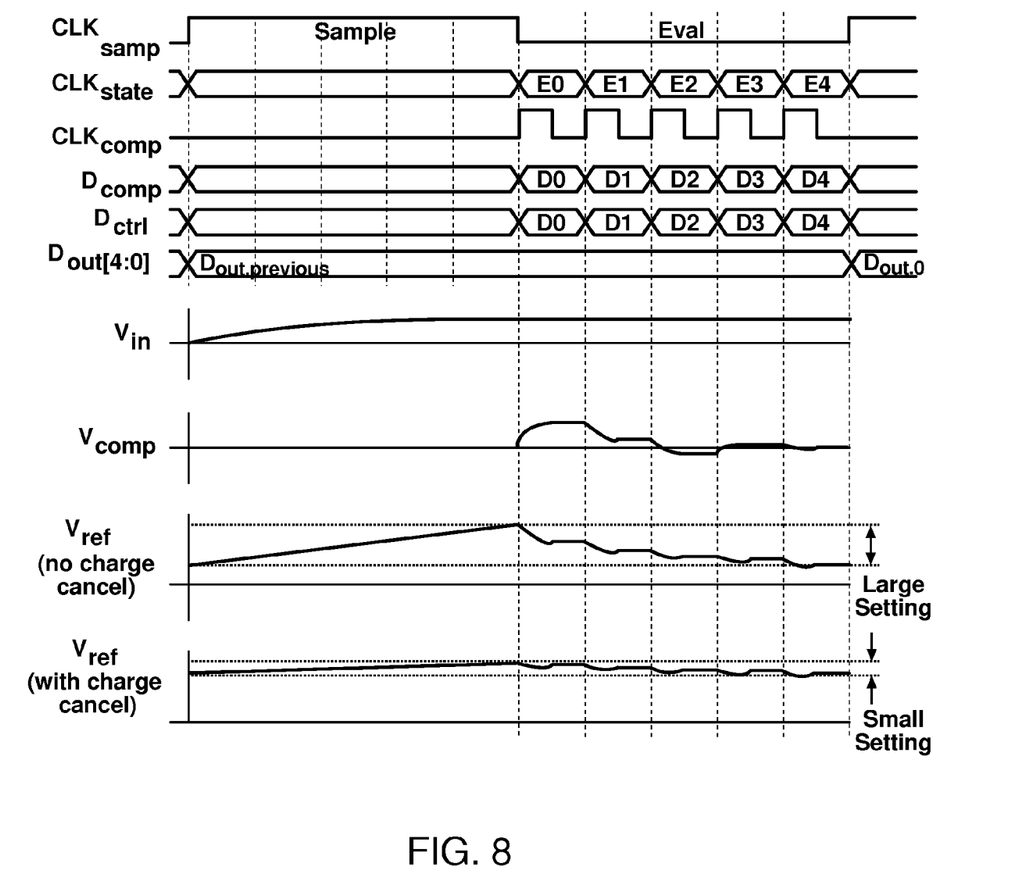
FIG. 8 is a timing graph with waveforms at different points in the block diagram of FIG. 7.

FIG. 7 is a block diagram of an exemplary ADC 20 that includes the ADC core 8 of FIG. 3 and a charge cancellation circuit 206 connected with the ADC core 8 and the reference buffer 10. FIG. 8 is a timing graph with waveforms at different points in the circuit diagram of FIG. 7 as will be discussed with reference to FIG. 8. The ADC core 8 may further include a switched-capacitor digital-to-analog converter (SCDAC) 212, a comparator 216 and a finite state machine (FSM) 220.

An initial explanation of the SCDAC and comparator were already provided with reference to FIG. 2. A sampled input voltage ($V_{in}$) goes onto the switched capacitors of the SCDAC, whether as differential inputs (as shown) or as a single input. The SCDAC takes $V_{in}$, $V_{ref}$ and $D_{ctrl}$ (discussed later as generated by the FSM 220) and calculates voltage inputs to the comparator 216 ($V_{comp}$) for each clock cycle E0 to E4 (FIG. 8), each corresponding to a bit to generate, in this example, a five-bit digital word. Accordingly, after any changes to the voltage on a switched capacitor due to reference hits from $V_{ref}$ (from a bypass capacitor), a differential voltage ($V_{comp,p}$ and $V_{comp,n}$) is output to the comparator 216. For each clock cycle E0 to E4, $V_{comp}$ will settle in response to comparator decisions. As $V_{comp}$ settles, charge will be pulled from (or added to) $V_{ref}$, which causes a "reference hit," thus changing the voltage of the bypass capacitor of the reference buffer, which causes reference voltage settling.

The comparator 216 compares the $V_{comp}$ values with a determined value, such as $V_{ref}/2$, a one (1) or a zero (0). Depending on the comparison within the comparator, a one or zero is output as a comparator output ($D_{comp}$), which is a resolved bit, at a transition of a comparator clock ($CLK_{comp}$) (FIG. 8).

The finite state machine (FSM) 220 buffers the resolved bits until all of a word (or other determined group of bits such as five in this case) is ready to be output at $D_{out}$, the output of the ADC 200. As the FSM 220 outputs the resolved word, a new sample period begins. The FSM 220 therefore may track previously resolved bits and perform an approximation calculation based on one or more previously resolved bit(s) to estimate a change in voltage to the switched capacitors for a next clock cycle. The FSM 220 may then output a control signal ($D_{ctrl}$) that includes whether to add or subtract charge from one or more switched capacitors (typically the next switched capacitor for which a bit will be resolved) to reach a voltage that more closely approximates a sampled input. The control signal may also encode an amount by which the charge should be added or subtracted from the switched capacitor, thus making it signal input dependent capable.

With additional reference to FIG. 8, the FSM 220 may also generate a state clock ($CLK_{state}$), whether synchronous or asynchronous, that is fed into the charge cancellation circuit 206. The state clock is synchronous if an external, synchronous clock is driving the comparator. The state clock is asynchronous if the comparator clock is asynchronous, transitioning only upon reference hits, which timing is controlled by the generation of the control signal by the FSM 220. When the comparator operates off an asynchronous clock, the FSM 220 may also generate an asynchronous comparator clock ($CLK_{comp}$) with which to drive timing of the comparator 216. The asynchronous comparator clock may be delayed slightly compared to the state clock to hold off the comparator firing the output ($D_{comp}$) long enough for settling voltage on the switched capacitor and for charge cancellation by the charge cancellation circuit 206.

The state clock may thus transition approximately at the reference hits, which occurs when the FSM generates the control signal ($D_{ctrl}$), so that the charge cancellation circuit 206 knows when a reference hit has occurred and may then supply the cancellation charge to the bypass capacitors at the correct time to keep $V_{ref}$ from falling too low, which would create large reference settling.

The output of the comparator 216 ($D_{comp}$) or of the FSM 220 ($D_{out}$) may also be fed into the charge cancellation circuit 206 so that the charge cancellation circuit may perform input signal dependent cancellation based on what the ADC core 8 has estimated the input signal to be. For instance, reference settling may depend on resolved bit transitions, e.g., zero to zero; zero to one; one to zero; and one to one. The reference voltage settling may be different where no bit transition occurs (e.g., one to one or zero to zero) as compared to when a bit transitions occurs between a one and a zero in either direction. The amount of cancellation voltage determined with regards to bit transition may be in addition to providing greater voltage adjustment, e.g., more on the MSB capacitor and progressively smaller adjustments for less significant bit resolutions.

When a reference hit occurs, the reference cancellation charge provided by the reference cancellation circuit 206 offsets (at least in part) the reference hit voltage on the bypass capacitors, reducing the signal swings and settling that would otherwise occur in the ADC of FIG. 1 (seen by comparing the last two waveforms of FIG. 8). With input signal dependent charge cancellation, the settling on the reference voltage may become more independent of the input, and thus provide better linearity in the reference voltage ($V_{ref}$), and thus more accurate and lower power operation of the ADC, even within high-speed circuit applications.

Charge cancellation may be implemented in a number of ways, which will be discussed in more detail with reference to FIGS. 9-12.

Figure 9:
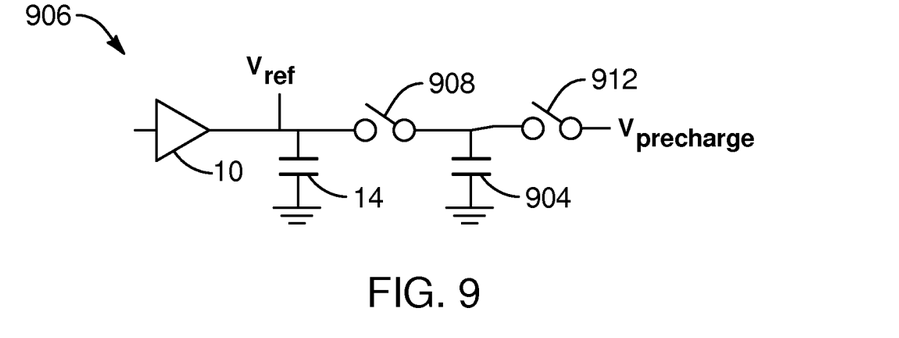
FIG. 9 is a block diagram of an exemplary charge cancellation circuit that includes a pre-charged capacitor.

FIG. 9 is a block diagram of an exemplary charge cancellation circuit 906 that includes a pre-charged capacitor 904. A cancellation switch 908 may be connected with the reference buffer 10, which supplies the reference voltage for the ADC. The cancellation switch 908 may further be connected with the capacitor 904 and pre-charge switch 912 of the cancellation circuit 206 connected with a voltage ($V_{precharge}$). The cancellation circuit may close the pre-charge switch 912 to allow the capacitor 904 to pre-charge to a voltage larger than the reference voltage, e.g., during the sampling phase. When the pre-charged capacitor 904 is connected with the reference voltage ($V_{ref}$) of the reference buffer through the cancellation switch 908 during charge cancellation, the pre-charged capacitor 904 equalizes and charge flows from the pre-charged capacitor to a bypass capacitor 14.

Similarly, the pre-charged capacitor 904 may be pre-charged to a voltage less than the reference voltage (Vref) through the pre-charge switch 912 so that, upon equalization after the switch 908 is closed during charge cancellation, the pre-charged capacitor may drain extra voltage off a bypass capacitor 14 when received from a switched capacitor during a reference hit.

Multiple pre-charged capacitors may be added in a bank of capacitors and can either be pre-charged to different voltages or may be different sized capacitors pre-charged to the same voltage, to allow for switching on different pre-charged voltages during different sized reference settling, which may be known in advance based on design choice.

Figure 10:
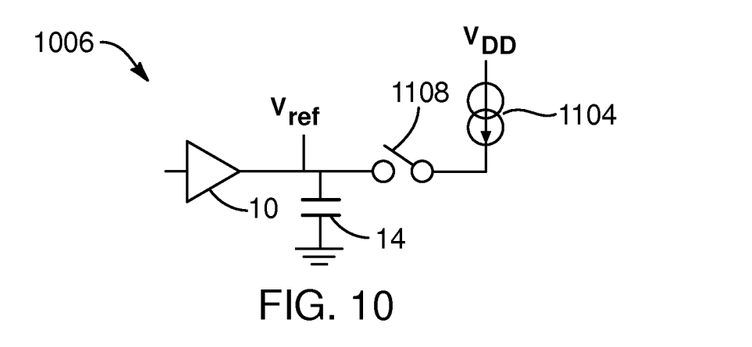
FIG. 10 is a block diagram of an exemplary charge cancellation circuit that includes a current source.

FIG. 10 is a block diagram of an exemplary charge cancellation circuit 1006 that includes a current source 1004. The current source 1004 may be a constant current source. The cancellation circuit 1006 may further include a cancellation switch 1008 that may be closed during charge cancellation for a determined period of time, sufficient to add charge onto a bypass capacitor 14 to add at least part of the charge back onto the bypass capacitor that was lost during a voltage hit.

Figure 11:
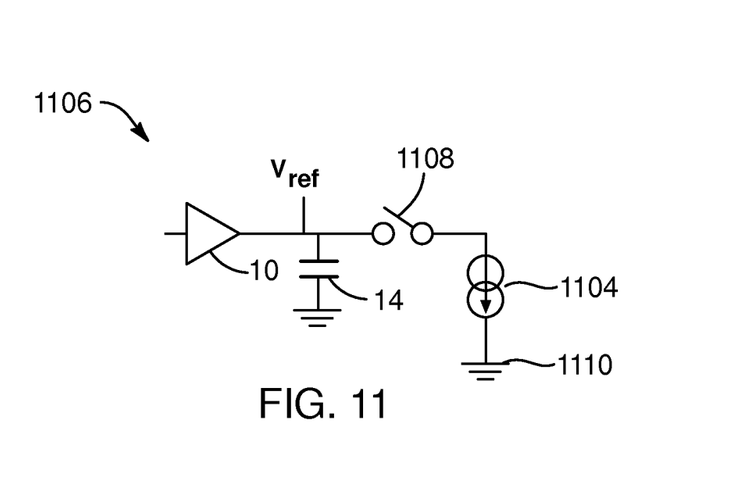
FIG. 11 is a block diagram of an exemplary charge cancellation circuit that includes a current sink.

FIG. 11 is a block diagram of an exemplary charge cancellation circuit 1106 that includes a current sink 1104, a constant source of current absorption, which may be run to a circuit ground 1110. The cancellation circuit 1106 may further include a cancellation switch 1108 that may be closed during charge cancellation for a determined period of time, sufficient to remove charge from the bypass capacitor 14 to remove at least part of the charge from the bypass capacitor that was added during a reference hit.

With respect to the cancellation circuits 1006 and 1106 of FIGS. 10 and 11, multiple current sources or multiple current sinks may connected with the reference buffer 10 in parallel to provide different amounts of current source or current absorption for different sized reference hits, according to design choice of the ADC.

Figure 12:
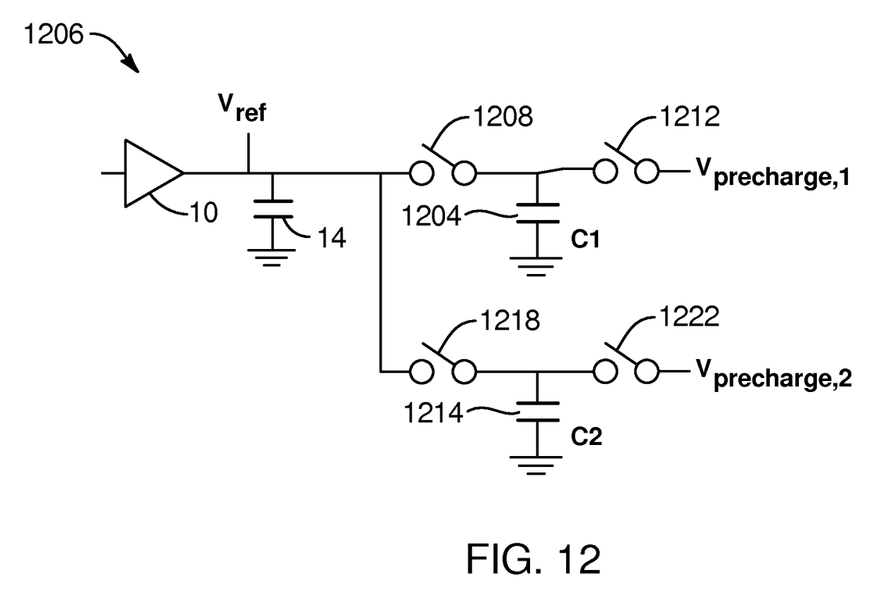
FIG. 12 is a block diagram of an exemplary charge cancellation circuit for signal dependent charge cancellation.

FIG. 12 is a block diagram of an exemplary charge cancellation circuit 1206 for signal dependent charge cancellation. The cancellation circuit 1206 may include a first pre-charged capacitor 1204, a first cancellation switch 1208 and a first pre-charge switch 1212. The cancellation circuit may further include a second pre-charged capacitor 1214, a second cancellation switch 1214 and a second pre-charge switch 1222. These sets of pre-charged capacitors and switches may be replicated to third and additional sets, as desired, to handle different expected reference hit sizes.

The pre-charging of the capacitors 1204 and 1218 through pre-charge switches 1212 and 1222 may occur during the sampling phase as discussed with reference to FIG. 9. When the first cancellation switch 1204 closes, an amount of charge is added to or removed from the bypass capacitor 14 depending on the voltage on the first pre-charged capacitor 1204. When the second cancellation switch 1218 closes, a different amount of charge is added to or removed from the bypass capacitor 14 depending on the voltage on the second pre-charged capacitor 1214. The amount of charge added or removed may be different depending on logic of the cancellation circuit 1206 that controls the switches 1208 and 1218. Varying the charge added or removed depending on variances in the input signal may remove input signal dependency in the reference settling, providing better linearity and accuracy in the reference voltage of the ADC.

For the input signal dependent charge cancellation, the capacitors 1204 and 1214 may be different sized capacitors pre-charged to the same voltage ($V_{precharge}$). Alternatively, the capacitors 1204 and 1214 may be the same sized capacitors pre-charged to different voltages ($V_{precharge1}$, $V_{precharge2}$). Additional switch and capacitor branches may be added for additional pre-charged voltage choices. Furthermore, the cancellation charges of the cancellation circuit 1206 of FIG. 12 may be provided by a constant current source and/or a constant current sink such as discussed with reference to FIGS. 10 and 11.

Figure 13:
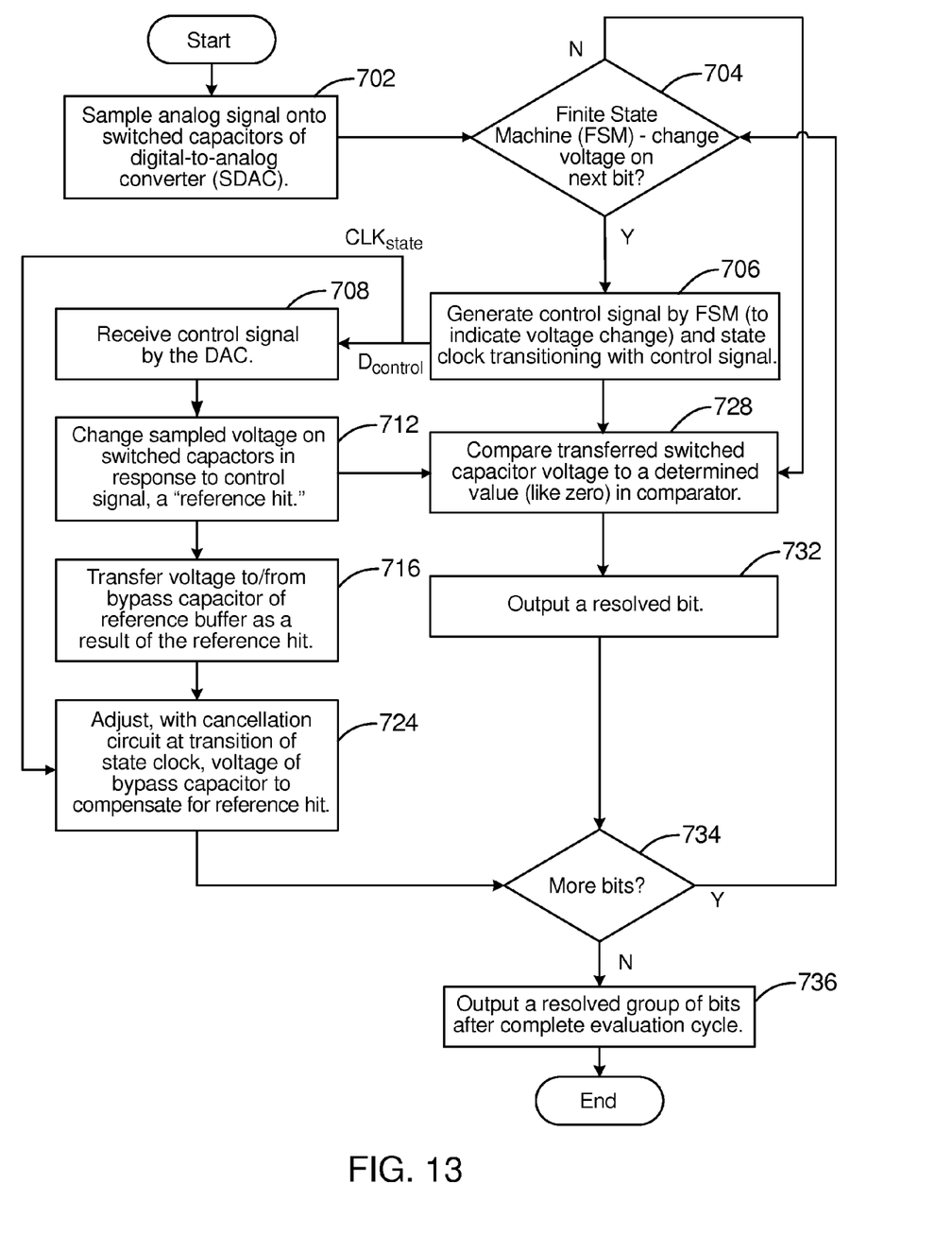
FIG. 13 is a flow diagram of logic that may be implemented for cancelling charge as changed on a bypass capacitor as a result of a reference hit taken in an ADC core such as that of FIGS. 3 and 7.

FIG. 13 is a flow diagram 700 of logic that an ADC may implement in hardware, software, or both for cancelling at least part of the charge as changed on a bypass capacitor during a reference hit taken in an ADC core (FIGS. 3 and 7). The ADC may sample an analog input signal onto switched capacitors of a switched capacitor digital-to-analog converter (SCDAC) (702). A finite state machine (FSM) of the ADC may determine whether a voltage on a switched capacitor needs to be changed for the next bit (704). If not, the logic may jump to resolving the bit within the comparator (728). If yes, the FSM may generate a control signal to indicate voltage change on the switched capacitor and generate a state clock that transitions with the control signal (706).

The SCDAC may receive the control signal from the FSM of the ADC (708). The SCDAC may change the voltage on a switched capacitor in response to the control signal, referred to herein as a reference hit (712). At least one switched capacitor of the SCDAC may transfer voltage to or remove voltage from the bypass capacitor of a reference buffer as a result of the reference hit, generating a comparator voltage ($V_{comp}$) and causing reference voltage settling (716).

A cancellation circuit may adjust, at a transition of the state clock, voltage of the bypass capacitor to reverse, at least in part, the reference hit taken by the bypass capacitor (724). The amount of adjusted voltage (or charge cancellation) on the bypass capacitor may be input signal independent or may be input signal dependent. If input signal dependent, the adjusted voltage may be made dependent on immediately preceding resolve bit(s) or a transition between an immediately preceding resolved bit and a currently resolved bit at the ADC output.

The comparator may compare the comparator voltage ($V_{comp}$) transferred from the switched capacitor to a determined value (like zero or one) in a comparator connected with the SCDAC (728). The comparator may output a resolved bit based on the comparison (732). The ADC may determine whether additional bits need to be resolved for a group of bits (734). The FSM connected with the comparator may buffer in memory any group of multiple resolved bits to output during a next sampling phase of the ADC (736).

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method comprising:
sampling an input signal onto a switched capacitor bank of an analog-to-digital converter (ADC);
charging a bypass capacitor to a reference voltage for the ADC;
detecting a voltage reference hit on the switched capacitor bank that causes a change in voltage on the bypass capacitor connected with the switched capacitor bank; and
when the reference hit occurs, selectively adjusting, by a cancellation circuit, the reference voltage of the bypass capacitor to at least partially offset a voltage distortion on the bypass capacitor caused by the reference hit.

2. The method of claim 1, where adjusting the voltage of the bypass capacitor comprises adding charge back onto the bypass capacitor removed by the switched capacitor.

3. The method of claim 2, where the added charge is supplied by a capacitor pre-charged to a voltage greater than a target reference voltage of the bypass capacitor.

4. The method of claim 2, where the added charge is supplied by a current source connected to the bypass capacitor for a determined amount of time.

5. The method of claim 1, where adjusting the voltage of the bypass capacitor comprises removing charge from the bypass capacitor added by the switched capacitor.

6. The method of claim 5, where the removed charge is taken by a capacitor pre-charged to a voltage less than a target reference voltage of the bypass capacitor.

7. The method of claim 5, where the removed charge is taken by a current sink connected to the bypass capacitor for a determined amount of time.

8. The method of claim 1, further comprising:
varying an amount of the adjustment to the reference voltage from cycle to cycle of a state clock during an evaluation period used to resolve a word worth of bits.

9. The method of claim 1, further comprising:
resolving a bit with a comparator connected with the ADC;
feeding the resolved bit into the cancellation circuit; and
making an amount of adjustment to the reference voltage dependent on a value of a previously resolved bit.

10. An analog-to-digital converter (ADC) comprising:
a switched capacitor bank for sampling an input signal of the ADC;
logic configured to estimate a change in voltage to the switched capacitor bank to more closely approximate a digital bit, the logic further configured to send a command to initiate a voltage reference hit to cause the change in voltage and to generate a state clock that transitions with sending the command;
a bypass capacitor connected with the switched capacitor bank to provide the change in voltage to the switched capacitor bank; and
a cancellation circuit connected with the logic and configured to, at the transition of the state clock, adjust a reference voltage of the bypass capacitor to reverse, at least in part, the change in the voltage of the bypass capacitor due to the reference hit.

11. The analog-to-digital converter of claim 10, further comprising:
a voltage comparator connected with the switched capacitor and configured to generate an output comprising a resolved bit, where the state clock is asynchronous, driven by timing of the output generated by the voltage comparator.

12. The analog-to-digital converter of claim 11, where the cancellation circuit is further configured to make an amount of the adjustment to the reference voltage dependent on a value of a previously resolved bit.

13. The analog-to-digital converter of claim 10, where the cancellation circuit comprises a switch activated by the state clock and connected with a pre-charged capacitor.

14. The analog-to-digital convert of claim 10, where the cancellation circuit comprises a switch activated by the state clock and connected with a current source or a current sink.

15. The analog-to-digital converter of claim 10, where the cancellation circuit is further configured to vary an amount of the adjustment to the reference voltage from cycle to cycle of the state clock during an evaluation period used to resolve a word of bits.

16. An analog-to-digital converter (ADC) comprising:
a switched capacitor bank for sampling an input signal of the ADC;
first logic configured to estimate a change in voltage to the switched capacitor bank to more closely approximate a digital bit, the first logic further configured to send a command to initiate a voltage reference hit to cause the change in voltage and to generate a state clock that transitions with sending the command;
a bypass capacitor connected with the switched capacitor bank to provide the change in voltage to the switched capacitor bank;
a voltage comparator connected with the first logic and configured to generate an output comprising a resolved bit; and
a cancellation circuit connected with the first logic and comprising multiple switches, connected in parallel, and second logic to close one of the switches responsive to a value of the resolved bit to, at the transition of the state clock, adjust the voltage of the bypass capacitor to at least partially offset the change in voltage of the bypass capacitor due to the reference hit.

17. The analog-to-digital converter of claim 16, where one of the multiple switches is closed depending on a value of a previously resolved bit.

18. The analog-to-digital converter of claim 16, where the multiple switches are each connected with a capacitor, at least some of the capacitors of different sizes and pre-charged to a determined voltage.

19. The analog-to-digital converter of claim 16, where the multiple switches are each connected with capacitors of the same size, at least some of the same-sized capacitors pre-charged to different voltages.

20. The analog-to-digital converter of claim 16, where respective multiple switches are connected with different-sized current sources or sinks for a determined pulse duration to respectively add or remove a determined amount of voltage from the bypass capacitors.

* * * * *